(12) United States Patent
Tu

(10) Patent No.: US 11,757,418 B2
(45) Date of Patent: Sep. 12, 2023

(54) AMPLIFYING CIRCUIT

(71) Applicant: Realtek Semiconductor Corporation, Hsinchu (TW)

(72) Inventor: Chih-Chan Tu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 72 days.

(21) Appl. No.: 17/494,883

(22) Filed: Oct. 6, 2021

(65) Prior Publication Data

US 2022/0302891 A1 Sep. 22, 2022

(30) Foreign Application Priority Data

Mar. 22, 2021 (TW) ................... 110110124

(51) Int. Cl.
*H03F 3/45* (2006.01)
*H03G 3/30* (2006.01)
*H03F 3/04* (2006.01)

(52) U.S. Cl.
CPC ............... *H03G 3/30* (2013.01); *H03F 3/04* (2013.01); *H03F 3/45071* (2013.01); *H03G 2201/103* (2013.01)

(58) Field of Classification Search
CPC .. H03G 3/30; H03G 2201/103; H03G 1/0088; H03G 1/0023; H03G 3/3042; H03F 3/04; H03F 2200/135; H03F 2200/144; H03F 2200/153; H03F 2200/234; H03F 2200/36; H03F 2203/45051; H03F 2203/45116; H03F 2203/45118; H03F 2203/45138; H03F 2203/45526; H03F 1/342; H03F 3/45475; H03F 1/42

See application file for complete search history.

(56) References Cited

U.S. PATENT DOCUMENTS 6,208,206 B1 * 3/2001 Leung .................... H03F 1/086
  330/109
6,573,791 B2 * 6/2003 Sridhar .................. H03F 1/083
  330/109

(Continued)

OTHER PUBLICATIONS

M. Abdulaziz et al., "A Compensation Technique for Two-Stage Differential OTAs," IEEE Transactions on Circuits and Systems II: Express Briefs, pp. 1-5, Aug. 2014.

(Continued)

*Primary Examiner* — Khanh V Nguyen
(74) *Attorney, Agent, or Firm* — Locke Lord LLP; Tim Tingkang Xia, Esq.

(57) ABSTRACT

An amplifying circuit including a first gain circuit, a second gain circuit, a Miller capacitor, a positive feedback circuit and a feedforward gain circuit. The second gain circuit is configured to receive a first gain signal from the first gain circuit and generate a second gain signal. The Miller capacitor, the positive feedback circuit and the feedforward gain circuit are electrically coupled between an input terminal and an output terminal of the second gain circuit. The positive feedback circuit is configured to feedback the signal of the output terminal of the second gain circuit to the input terminal of the second gain circuit. The feedforward gain circuit is configured to amplify the first gain signal to output a third gain signal to the output terminal of the second gain circuit.

11 Claims, 4 Drawing Sheets

(56) References Cited

U.S. PATENT DOCUMENTS

| | | | | |
|---|---|---|---|---|
| 7,495,422 | B2* | 2/2009 | Mok | G05F 1/575 |
| | | | | 323/280 |
| 8,847,678 | B2* | 9/2014 | Chen | G05F 1/575 |
| | | | | 323/280 |
| 9,041,467 | B2* | 5/2015 | Sutardja | H03F 3/191 |
| | | | | 330/109 |
| 9,768,740 | B2* | 9/2017 | Zhang | H03F 3/195 |
| 9,954,501 | B2* | 4/2018 | Garbarino | H03F 3/45659 |
| 2007/0103232 | A1* | 5/2007 | Chen | H03F 1/34 |
| | | | | 330/109 |
| 2008/0062022 | A1* | 3/2008 | Melanson | H03M 3/464 |
| | | | | 341/143 |
| 2008/0062026 | A1* | 3/2008 | Melanson | H03M 3/412 |
| | | | | 341/155 |
| 2008/0272844 | A1 | 11/2008 | Rayanakorn et al. | |
| 2014/0232465 | A1* | 8/2014 | Yan | H03F 3/45192 |
| | | | | 330/260 |

OTHER PUBLICATIONS

C.-Y. Ho et al., "A 75.1dB SNDR, 80.2dB DR, 4th-order Feed-forward Continuous-Time Sigma-Delta Modulator with Hybrid Integrator for Silicon TV-tuner Application," IEEE Asian Solid-State Circuits Conference, pp. 261-264, Nov. 14-16, 2011.

Ka Nang Leung et al., "Analysis of Multistage Amplifier-Frequency Compensation," IEEE Transactions on Circuits and Systems I: Fundamental Theory and Applications, vol. 48, No. 9, pp. 1041-1056, Sep. 2001.

* cited by examiner

AMPLIFYING CIRCUIT

CROSS-REFERENCE TO RELATED APPLICATION

This application claims priority to Taiwan Application Serial Number 110110124, filed Mar. 22, 2021, which is herein incorporated by reference in its entirety.

BACKGROUND

Technical Field

The present disclosure relates to an amplifying circuit, which is configured to gain the received signal.

Description of Related Art

Operational amplifier is a basic unit used to form an analog circuit. Generally speaking, an amplifying circuit of the operational amplifier may include multiple gain circuits for amplifying the received signal. The ratio between the output voltage and input voltage of the gain circuit is called "gain". The larger the gain, the larger the circuit structure of the gain circuit. Accordingly, how to balance the volume, gain, and stability of the amplifying circuit in the operational amplifier will be a major issue.

SUMMARY

One aspect of the present disclosure is an amplifying circuit, comprising a first gain circuit, a second gain circuit, a Miller capacitor, a positive feedback circuit and a feedforward gain circuit. The first gain circuit is configured to amplify an input signal to generate a first gain signal. The second gain circuit is electrically coupled to the first gain circuit, and is configured to amplify the first gain signal to generate a second gain signal. The Miller capacitor is electrically coupled between to an input terminal and an output terminal of the second gain circuit. The positive feedback circuit is electrically coupled between to the input terminal and the output terminal of the second gain circuit, and is configured to feedback a signal of the output terminal of the second gain circuit to the input terminal of the second gain circuit. The feedforward gain circuit is electrically coupled between to the input terminal and the output terminal of the second gain circuit. The feedforward gain circuit is configured to amplify the first gain signal to output a third gain signal to the output terminal of the second gain circuit.

Another aspect of the present disclosure is an amplifying circuit, comprising a first gain circuit, a second gain circuit, a positive feedback circuit, a positive feedback circuit and a feedforward gain circuit. The first gain circuit is configured to amplify an input signal to generate a first gain signal. The second gain circuit is electrically coupled to the first gain circuit, and configured to amplify the first gain signal to generate a second gain signal. The positive feedback circuit is electrically coupled between to an input terminal and an output terminal of the second gain circuit, and configured to feedback a signal of the output terminal of the second gain circuit to the input terminal of the second gain circuit. The feedforward gain circuit is electrically coupled between to the input terminal and the output terminal of the second gain circuit, comprising at least two feedforward gain amplifiers, wherein the at least two feedforward gain amplifiers are configured to amplify the first gain signal to output a third gain signal to the output terminal of the second gain circuit.

Another aspect of the present disclosure is an amplifying circuit, comprising a first gain circuit, a second gain circuit, a Miller capacitor and a feedforward gain circuit. The first gain circuit is configured to amplify an input signal to generate a first gain signal. The second gain circuit is electrically coupled to the first gain circuit, and is configured to amplify the first gain signal to generate a second gain signal. The Miller capacitor is electrically coupled between to an input terminal and an output terminal of the second gain circuit. The feedforward gain circuit is electrically coupled between to the input terminal and the output terminal of the second gain circuit, and comprises a first feedforward gain amplifier, a second feedforward gain amplifier and a feedforward capacitor. A first terminal of the feedforward capacitor is electrically coupled between the first feedforward gain amplifier and the second feedforward gain amplifier. The first feedforward gain amplifier and the second feedforward gain amplifier are configured to amplify the first gain signal to output a third gain signal to the output terminal of the second gain circuit.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
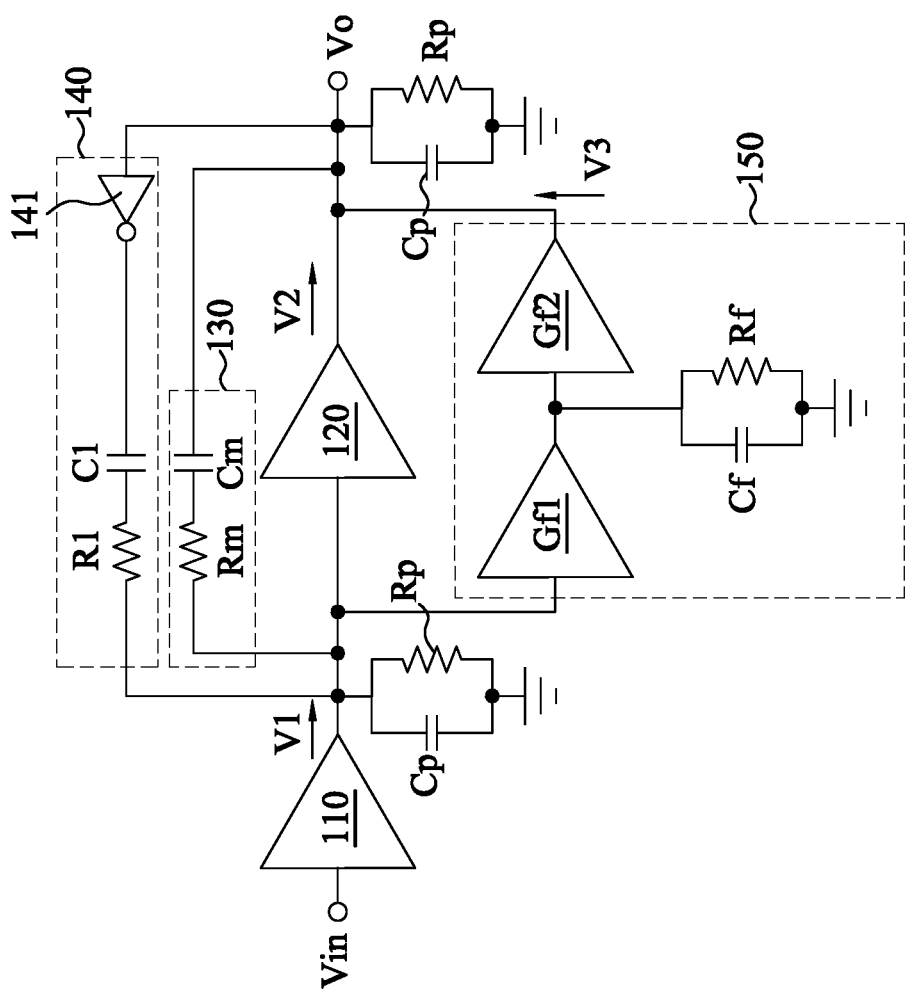
FIG. 1 is a schematic diagram of an amplifying circuit in some embodiments of the present disclosure.

FIG. 1 is a schematic diagram of an amplifying circuit 100 in some embodiments of the present disclosure. In one embodiment, the amplifying circuit 100 is configured to form an Operational Amplifier. In other words, the amplifying circuit 100 receives an input signal Vin, then enhances the input signal Vin, so as to output an output signal Vo.

As shown in FIG. 1, in some embodiments, the amplifying circuit 100 includes a first gain circuit 110, a second gain circuit 120, a Miller capacitor Cm, a positive feedback circuit 140 and a feedforward gain circuit 150. The first gain circuit 110 and the second gain circuit 120 are configured to amplify the received signal. In some embodiments, the gain circuit 110/120 may include a differential amplifier, but the present disclosure is not limited to this. One of ordinary skill in the art can understand the various implements of the gain circuit, and thus they are not further detailed herein.

The first gain circuit 110 is configured to receive the input signal Vin, then amplify the input signal Vin, and output a first gain signal V1. The input terminal of the second gain circuit 120 is electrically coupled to the output terminal of the first gain circuit 110, so as to receive the first gain signal V1. The second gain circuit 120 amplifies the first gain signal V1 again to output a second gain signal V2.

In some embodiments, the gain of the first gain circuit 110 is -gm1, and the gain of the second gain circuit 120 is -gm2. Alternatively stated, the first gain circuit 110 will amplify the input signal Vin by a multiple of "gm1", and the phase of the output first gain signal V1 is opposite to the phase of the input signal Vin. Similarly, the second gain circuit 120 will amplify the first gain signal V1 by a multiple of "gm2", and the phase of the output second gain signal V2 is opposite to the phase of the first gain signal V1.

The Miller capacitor Cm is electrically coupled between the input terminal and the output terminal of the second gain circuit 120. In some embodiments, the Miller capacitor Cm is arranged in a negative feedback circuit 130 of the amplifying circuit 100, and is electrically coupled in series with a negative feedback resistor Rm of the negative feedback circuit 130. The negative feedback circuit 130 is electrically coupled between the input terminal and the output terminal of the second gain circuit 120. The negative feedback circuit 130 will stabilize the system stability of the amplifying circuit 100 through the Miller effect of the Miller capacitor Cm.

The positive feedback circuit 140 is electrically coupled between the input terminal and the output terminal of the second gain circuit 120, and is configured to feedback the signal from the output terminal of the second gain circuit 120 to the input terminal of the second gain circuit 120. In some embodiments, the positive feedback circuit 140 includes a positive feedback capacitor C1 and a positive feedback resistor R1. The positive feedback capacitor C1 is electrically coupled in series with the positive feedback resistor R1.

As shown in FIG. 1, the positive feedback circuit 140 further includes an inverter 141, it means that the positive feedback circuit 140 transmits the signal of the output terminal of the second gain circuit 120 to the input terminal of the second gain circuit 120 in the same phase. In other words, the positive feedback circuit 140 is electrically coupled to a positive terminal of the input terminals of the second gain circuit 120. Similarly, the negative feedback circuit 130 is electrically coupled to a negative terminal of the input terminals of the second gain circuit 120.

Figure 2:
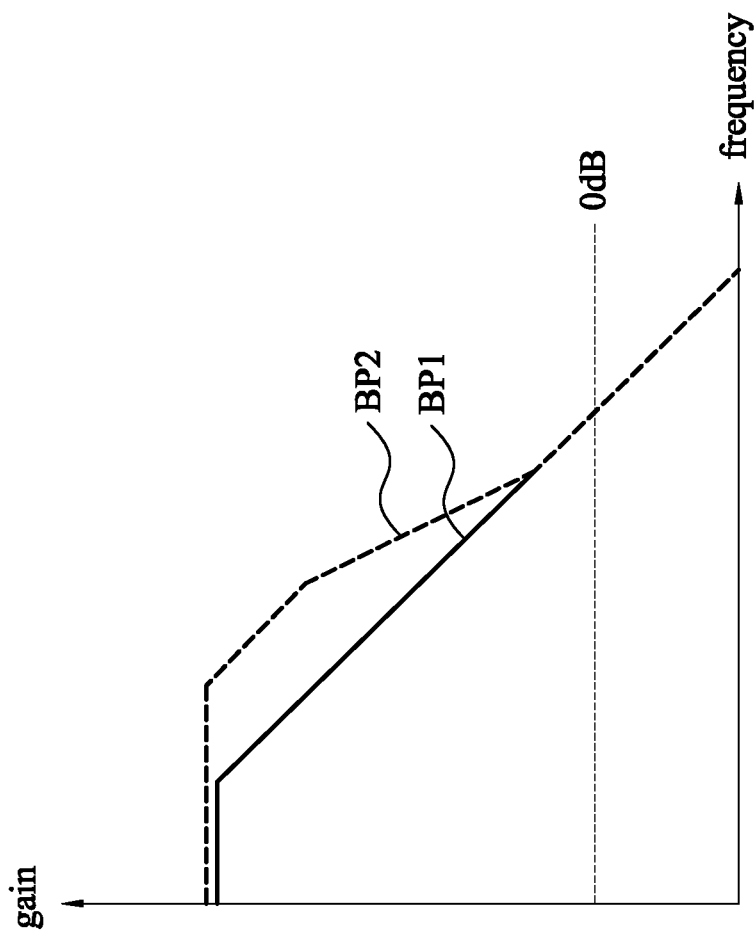
FIG. 2 is a Bode plot of the partial circuit of the amplifying circuit in some embodiments of the present disclosure.

FIG. 2 is a Bode plot of the partial circuit of the amplifying circuit 100 in some embodiments of the present disclosure. The Bode plot shows that the Miller capacitor has improved stability for the amplifying circuit 100. The horizontal axis is frequency, expressed in logarithm, and the vertical axis is the gain, expressed in decibels (dB). Each turning of the line in the Bode plot represents a pole or a zero, and corresponds to a pole frequency or a zero frequency of the circuit. "Pole" decreases the slope of the line in the Bode plot by "20 dB/decade", and "Zero" increases the slope of the line in the Bode plot by "20 dB/decade". One of ordinary skill in the art can understand the Bode plot, and thus they are not further detailed herein.

As shown in FIG. 2, If the amplifying circuit 100 only uses the first gain circuit 110 and the second gain circuit 120 to perform gain processing on the input signal Vin, and connect the input terminal and the output terminal of the second gain circuit 120 through the Miller capacitor Cm (i.e., including the negative feedback circuit 130), it forms a traditional two-stage Miller amplifier, and its characteristics are shown in the Bode plot BP1.

The Bode plot BP2 in FIG. 2 represents the characteristics that the amplifying circuit 100 includes the first gain circuit 110, the second gain circuit 120, the Miller capacitor Cm and the positive feedback circuit 140. Comparing the Bode plot BP1 and the Bode plot BP2, after adding the positive feedback circuit 140, the pole frequency of the circuit becomes higher, and a new pole and a new zeros are added. The single gain (0 dB) bandwidth of the Bode plot BP2 is the same as the Bode plot BP1, so a larger medium frequency bandwidth can be achieved.

The Bode plot shown in FIG. 2 does not include the feedforward gain circuit 150 yet. The impact of the feedforward gain circuit 150 on the system will be explained in subsequent paragraphs.

The feedforward gain circuit 150 is electrically coupled between the input terminal and the output terminal of the second gain circuit 120. The input terminal of the feedforward gain circuit 150 is electrically coupled to the output terminal of the first gain circuit 110, so as to receive the first gain signal V1. The feedforward gain circuit 150 is configured to amplify the first gain signal V1, so as to output the third gain signal V3 to the output terminal of the second gain circuit 120.

Figure 3:
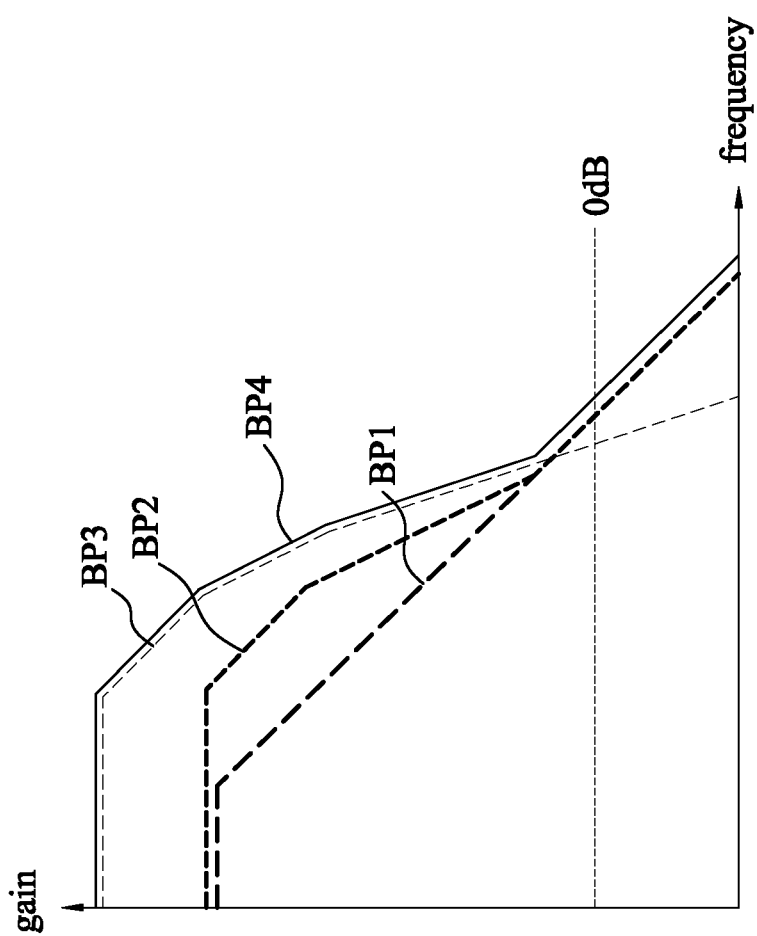
FIG. 3 is a Bode plot of the amplifying circuit in some embodiments of the present disclosure.

FIG. 3 is a Bode plot of the amplifying circuit 100 in some embodiments of the present disclosure. As mentioned above, the Bode plot BP1 represents a characteristic that the open-loop gain of the first gain circuit 110, the second gain circuit 120 and the negative feedback circuit 130 for the input signal Vin. The Bode plot BP2 represents a characteristic that the gain of the first gain circuit 110, the second gain circuit 120, the negative feedback circuit 130 and the positive feedback circuit 140 for the input signal Vin. The Bode plot BP3 represents a characteristic that the gain of the first gain circuit, the second gain circuit 120 and the feedforward gain circuit 150 (but not considering the negative feedback circuit 130 and the positive feedback circuit 140).

Alternatively stated, the Bode plot BP1 represents a characteristic of a two-stage amplifying circuit (i.e., amplify the input signal Vin only through the first gain circuit 110 and the second gain circuit 120). The Bode plot BP2 and the Bode plot BP3 represent a characteristic that adding different improved circuits to the two-stage amplifier circuit (i.e., the negative feedback circuit 130, the positive feedback circuit 140, the feedforward gain circuit 150). As shown in figures, the feedforward gain circuit 150 has a higher gain and a higher pole frequency, so the low frequency gain can be significantly amplified.

In the present application, the negative feedback circuit 130, the positive feedback circuit 140 and the feedforward gain circuit 150 are added to the structure of the two-stage amplifying circuit (i.e., the first gain circuit 110 and the second gain circuit 120) to form the amplifying circuit 100. Therefore, the overall signal characteristics of the amplifying circuit 100 can be regarded as the integration of the Bode plot BP1-BP3, that is, the Bode plot BP4 in FIG. 3. The negative feedback circuit 130 is configured to improve the overall stability of the circuit. The positive feedback circuit 140 is configured to improve bandwidth. The feedforward gain circuit 150 amplifies the low frequency gain. Accordingly, the gain value required by the second gain circuit 120 can be reduced to facilitate circuit design.

In the above embodiments, the amplifying circuit 100 can simultaneously improve stability, bandwidth and gain, but the present disclosure is not limited to this. The negative feedback circuit 130 and the positive feedback circuit 140 can be selectively set according to the requirements of the Operational Amplifier. In some embodiments, the amplifying circuit 100 can only use the positive feedback circuit 140 to improve the bandwidth, and the feedforward gain circuit 150 can amplify the low-frequency gain. In other embodiments, the amplifying circuit 100 can only use the negative feedback circuit 130 to improve the stability, and use the feedforward gain circuit 150 to amplify the low-frequency gain.

Specifically, the feedforward gain circuit 150 includes multiple feedforward gain amplifiers. The feedforward gain amplifiers may be implemented by the differential amplifier, but the present disclosure is not limited thereto. As shown in FIG. 1, the feedforward gain circuit 150 includes a first feedforward gain amplifier Gf1 and a second feedforward gain amplifier Gf2. The first feedforward gain amplifier Gf1 is electrically coupled in series with the second feedforward gain amplifier Gf2. The feedforward gain circuit 150 forms a multiple-stage amplifying circuit coupled in parallel with the second gain circuit 120 by the first feedforward gain amplifier Gf1 and the second feedforward gain amplifier Gf2. Therefore, each of the feedforward gain amplifiers Gf1, Gf2 and the gain circuit 110/120 does not need to have high gain values.

In some embodiments, the feedforward gain circuit 150 further includes a feedforward capacitor Cf. A first terminal of the feedforward capacitor Cf is electrically coupled between the feedforward gain amplifiers Gf1, Gf2. A second terminal of the feedforward capacitor Cf is electrically coupled to ground, and is configured to stabilize the feedforward gain circuit 150. The feedforward capacitor Cf is electrically coupled between the input terminal and the output terminal of the feedforward gain circuit 150 not as a Miller capacitor. After testing, the performance of the feedforward capacitor Cf coupled to the ground is more stable than the Miller effect by the Miller capacitor, but the feedforward capacitor Cf is not a necessary component for the present disclosure.

As mentioned above, in some embodiments, the feedforward gain circuit 150 further includes a first resistor Rf, the first resistor Rf is electrically coupled in parallel with the feedforward capacitor Cf. In addition, the amplifying circuit 100 further includes multiple parasitic resistors Rp and a parasitic capacitor Cp. It should be note that the parasitic resistors Rp and the parasitic capacitor Cp shown in FIG. 1 are only for explaining the influence of parasitic components, and the parasitic resistor Rp and the parasitic capacitor Cp may not be independent resistive elements or independent capacitive elements in the circuit.

Figure 4:
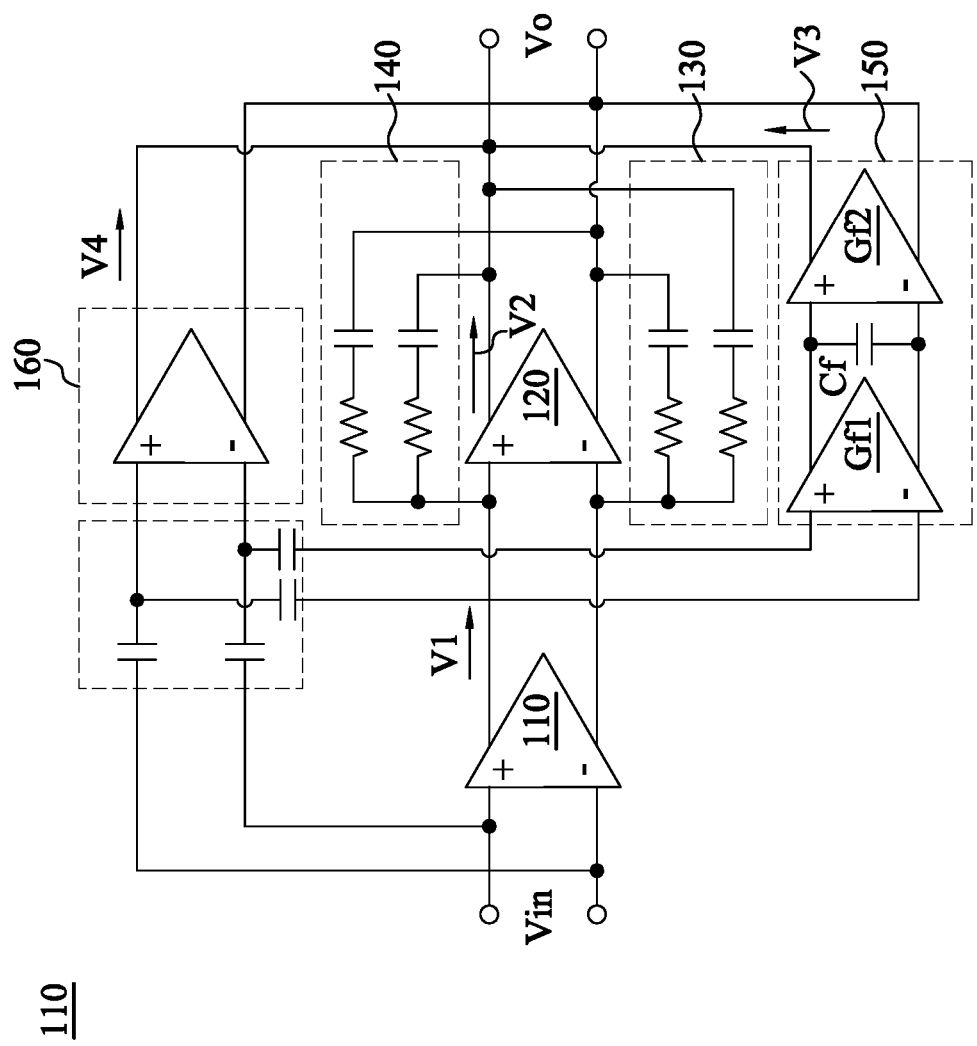
FIG. 4 is a schematic diagram of an amplifying circuit in some embodiments of the present disclosure.

FIG. 4 is a schematic diagram of an amplifying circuit 100 in other embodiments of the present disclosure. In FIG. 4, the similar components associated with the embodiment of FIG. 1 are labeled with the same numerals for ease of understanding. The specific principle of the similar component has been explained in detail in the previous paragraphs, and unless it has a cooperative relationship with the components of FIG. 4, it is not repeated here. FIG. 4 shows the positive input terminal and negative input terminal of each gain circuit.

As shown in FIG. 4, in some embodiments, the amplifying circuit 100 further includes an auxiliary gain circuit 160. The auxiliary gain circuit 160 is electrically coupled between the input terminal of the first gain circuit 110 and the output terminal of the second gain circuit 120, and also belong a feedforward circuit to improve the stability of high frequency signals. In other words, the auxiliary gain circuit 160 may gain the input signal Vin, and outputs the fourth gain signal V4 to the output terminal of the second gain circuit 120. In some embodiments, the auxiliary gain circuit 160 includes a differential amplifier. The positive input terminal and the negative input terminal of the differential amplifier are electrically coupled to the input terminals of the first gain circuit 110.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. An amplifying circuit, comprising:
   a first gain circuit configured to amplify an input signal to generate a first gain signal;
   a second gain circuit electrically coupled to the first gain circuit, and configured to amplify the first gain signal to generate a second gain signal;
   a Miller capacitor electrically coupled between to an input terminal and an output terminal of the second gain circuit;
   a positive feedback circuit electrically coupled between to the input terminal and the output terminal of the second gain circuit, and configured to feedback a signal of the output terminal of the second gain circuit to the input terminal of the second gain circuit;
   a feedforward gain circuit electrically coupled between to the input terminal and the output terminal of the second gain circuit, wherein the feedforward gain circuit is configured to amplify the first gain signal to output a third gain signal to the output terminal of the second gain circuit; and
   a negative feedback circuit comprising the Miller capacitor and a negative feedback resistor, wherein the negative feedback resistor is electrically coupled in series with the Miller capacitor.

2. The amplifying circuit of claim 1, wherein the feedforward gain circuit comprises a plurality of feedforward gain amplifiers and a feedforward capacitor, a first terminal of the feedforward capacitor is electrically coupled between the plurality of feedforward gain amplifiers, and a second terminal of the feedforward capacitor is electrically coupled to ground.

3. The amplifying circuit of claim 2, wherein the feedforward gain circuit further comprises a first resistor, and the first resistor is electrically coupled in parallel with the feedforward capacitor.

4. The amplifying circuit of claim 1, wherein the positive feedback circuit comprises a positive feedback capacitor and a positive feedback resistor, and the positive feedback capacitor is electrically coupled in series with the positive feedback resistor.

5. An amplifying circuit, comprising:
a first gain circuit configured to amplify an input signal to generate a first gain signal;
a second gain circuit electrically coupled to the first gain circuit, and configured to amplify the first gain signal to generate a second gain signal;
a positive feedback circuit electrically coupled between to an input terminal and an output terminal of the second gain circuit, and configured to feedback a signal of the output terminal of the second gain circuit to the input terminal of the second gain circuit;
a feedforward gain circuit electrically coupled between to the input terminal and the output terminal of the second gain circuit, comprising at least two feedforward gain amplifiers, wherein the at least two feedforward gain amplifiers are configured to amplify the first gain signal to output a third gain signal to the output terminal of the second gain circuit; and
a negative feedback circuit comprising a Miller capacitor and a negative feedback resistor, wherein the Miller capacitor is electrically coupled between to the input terminal and the output terminal of the second gain circuit, and the negative feedback resistor is electrically coupled in series with the Miller capacitor.

6. The amplifying circuit of claim 5, wherein the feedforward gain circuit further comprises a feedforward capacitor, a first terminal of the feedforward capacitor is electrically coupled between the at least two feedforward gain amplifiers, and a second terminal of the feedforward capacitor is electrically coupled to ground.

7. The amplifying circuit of claim 6, wherein the feedforward gain circuit further comprises a first resistor, and the first resistor is electrically coupled in parallel with the feedforward capacitor.

8. The amplifying circuit of claim 5, wherein the positive feedback circuit comprises a positive feedback capacitor and a positive feedback resistor, and the positive feedback capacitor is electrically coupled in series with the positive feedback resistor.

9. An amplifying circuit, comprising:
a first gain circuit configured to amplify an input signal to generate a first gain signal;
a second gain circuit electrically coupled to the first gain circuit, and configured to amplify the first gain signal to generate a second gain signal;
a Miller capacitor electrically coupled between to an input terminal and an output terminal of the second gain circuit;
a feedforward gain circuit electrically coupled between to the input terminal and the output terminal of the second gain circuit, and comprising a first feedforward gain amplifier, a second feedforward gain amplifier and a feedforward capacitor, wherein a first terminal of the feedforward capacitor is electrically coupled between the first feedforward gain amplifier and the second feedforward gain amplifier, the first feedforward gain amplifier and the second feedforward gain amplifier are configured to amplify the first gain signal to output a third gain signal to the output terminal of the second gain circuit; and
a positive feedback circuit electrically coupled between to the input terminal and the output terminal of the second gain circuit, and configured to feedback a signal of the output terminal of the second gain circuit to the input terminal of the second gain circuit, wherein the positive feedback circuit comprises a positive feedback capacitor and a positive feedback resistor, and the positive feedback capacitor is electrically coupled in series with the positive feedback resistor.

10. The amplifying circuit of claim 9, wherein a second terminal of the feedforward capacitor is electrically coupled to ground.

11. The amplifying circuit of claim 9, wherein the feedforward gain circuit further comprises a first resistor, and the first resistor is electrically coupled in parallel with the feedforward capacitor.

\* \* \* \* \*